(12) United States Patent
Green

(10) Patent No.: US 11,921,527 B2
(45) Date of Patent: Mar. 5, 2024

(54) HIGH-SPEED OPTOCOUPLER CIRCUITS

(71) Applicant: Copeland LP, Sidney, OH (US)

(72) Inventor: Charles E. Green, Fenton, MO (US)

(73) Assignee: Copeland LP, Sidney, OH (US)

( * ) Notice: Subject to any disclaimer, the term of this patent is extended or adjusted under 35 U.S.C. 154(b) by 660 days.

(21) Appl. No.: 17/102,624

(22) Filed: Nov. 24, 2020

(65) Prior Publication Data
US 2021/0157347 A1 May 27, 2021

Related U.S. Application Data

(60) Provisional application No. 62/941,406, filed on Nov. 27, 2019.

(51) Int. Cl.
| | |
|---|---|
| G05D 23/24 | (2006.01) |
| G01R 19/165 | (2006.01) |
| G05B 19/042 | (2006.01) |

(52) U.S. Cl.
CPC ... *G05D 23/2454* (2013.01); *G01R 19/16523* (2013.01); *G05B 19/0423* (2013.01)

(58) Field of Classification Search
None
See application file for complete search history.

(56) References Cited

U.S. PATENT DOCUMENTS

| | | | | | |
|---|---|---|---|---|---|
| 5,949,085 | A * | 9/1999 | Barrett | .................. | H04B 10/802 |
| | | | | | 250/551 |
| 6,373,045 | B1 * | 4/2002 | Bray | .................... | H04B 10/801 |
| | | | | | 250/214 R |
| 6,463,113 | B1 * | 10/2002 | Shusterman | ............ | H04L 25/26 |
| | | | | | 333/81 R |
| 2011/0278918 | A1 * | 11/2011 | Shindo | ...................... | B60L 3/04 |
| | | | | | 361/18 |
| 2014/0077792 | A1 * | 3/2014 | Equihua | .................... | G05F 1/56 |
| | | | | | 307/113 |

OTHER PUBLICATIONS

International Search Report regarding Application No. PCT/US2020/062461 dated Mar. 23, 2021.
Written Opinion of the ISA regarding Application No. PCT/US2020/062461 dated Mar. 23, 2021.

* cited by examiner

*Primary Examiner* — David W Lambert
(74) *Attorney, Agent, or Firm* — Harness, Dickey & Pierce, P.L.C.

(57) ABSTRACT

An optocoupler circuit includes first and second resistors, an optocoupler, a reference circuit, and a comparator. The optocoupler includes a light source and a phototransistor. The light source is connected to form a first voltage divider with the first resistor. The phototransistor is connected to form a second voltage divider with the second resistor. The optocoupler transitions an output of the second voltage divider between first and second levels. Magnitudes of the first and second levels are greater than zero. The reference circuit is configured to output a reference voltage. The comparator includes a first input and a second input. The first input receives an output of the first voltage divider. The second input receives the reference voltage. An output of the comparator transitions between a third level and a fourth level based on a comparison between the output of the first voltage divider and the reference voltage.

24 Claims, 8 Drawing Sheets

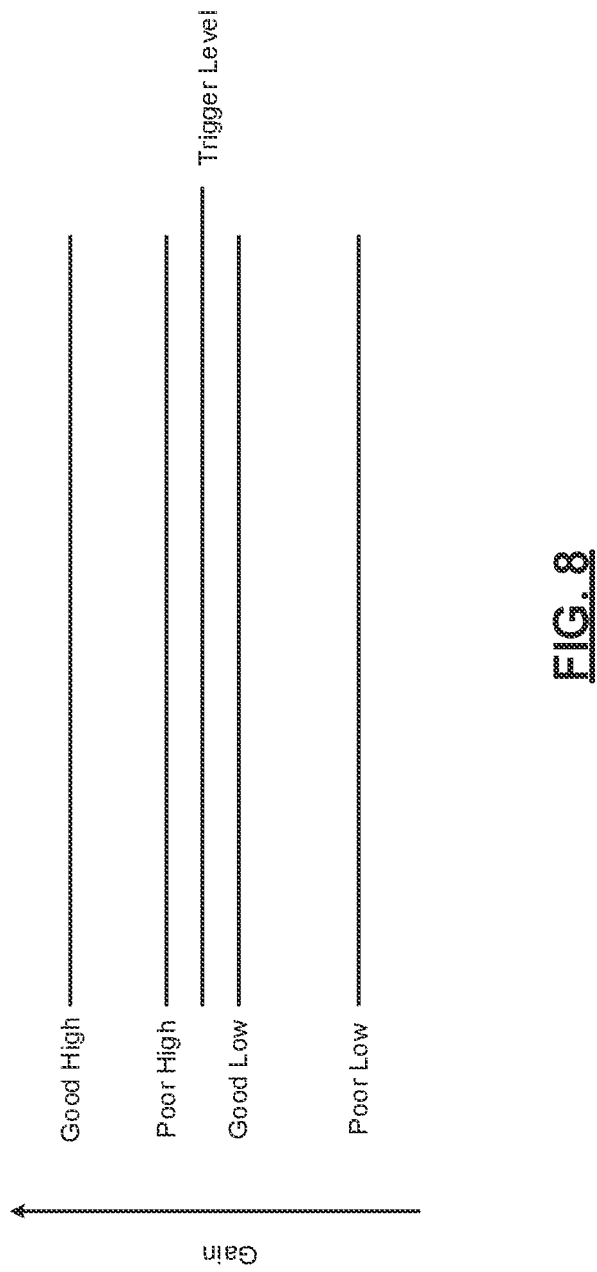

HIGH-SPEED OPTOCOUPLER CIRCUITS

CROSS-REFERENCE TO RELATED APPLICATIONS

This application claims the benefit of U.S. Provisional Application No. 62/941,406, filed on Nov. 27, 2019. The entire disclosure of the application referenced above is incorporated herein by reference.

FIELD

The present disclosure relates to isolation circuits and more particularly to opto-isolators (optocoupler) circuits.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An opto-isolator (or optocoupler) is an electronic component that transfers electrical signals between two circuits using light. The two circuits are isolated from each other via the optocoupler. An optocoupler prevents, for example, a high-voltage on the first circuit from negatively affecting and/or being received at the second circuit, which may operate at lower voltages. An optocoupler typically includes a light source (e.g., a light emitting diode (LED)), a dielectric barrier, and a phototransistor and operates as a voltage-to-voltage converter. The light source receives an input voltage and the phototransistor detects an illumination level of the light source and provides an output voltage that is different, but directly related to the input voltage.

SUMMARY

An optocoupler circuit is provided and includes a first resistor, a second resistor, an optocoupler, a reference circuit, and a comparator. The optocoupler includes a light source and a phototransistor. The light source is connected to form a first voltage divider with the first resistor. The phototransistor is connected to form a second voltage divider with the second resistor. The optocoupler transitions an output of the second voltage divider between a first level and a second level. Magnitudes of the first level and the second level are greater than zero. The reference circuit is configured to output a reference voltage. The comparator includes a first input and a second input. The first input receives an output of the second voltage divider. The second input receives the reference voltage. An output of the comparator transitions between a third level and a fourth level based on a comparison between the output of the first voltage divider and the reference voltage.

In other features, the optocoupler circuit further includes a Zener diode including a cathode. The cathode is connected to the first input of the comparator. In other features, the optocoupler circuit further includes an input transistor connected in series with the light source. In other features, the optocoupler circuit further includes a third resistor connected in series with the light source and the input transistor.

In other features, the input transistor and the third resistor are collectively connected in parallel with the first resistor. In other features, the optocoupler circuit further includes a pull-up resistor connected to the output of the comparator.

In other features, the first resistor and the second resistor are connected to different ground reference terminals. In other features, the first voltage divider receives power from a first power source and the second voltage divider receives power from a second power source.

In other features, the reference circuit includes: a third resistor connected to the second input of the comparator and receiving a supply voltage; a fourth resistor connected to the second input and a ground reference terminal; and a capacitor connected in parallel with the fourth resistor.

In other features, a system is provided and includes: a temperature sensor configured to generate a temperature signal; the optocoupler circuit, where the optocoupler circuit is configured to generate an output signal based on the temperature signal; and a control module configured to receive the output signal and perform an operation based on the output signal.

In other features, the reference circuit further includes a capacitor connected in parallel with the fourth resistor.

In other features, a system is provided and includes the optocoupler circuit, where the optocoupler circuit is configured to generate an output signal based on received transmit enable signal; and a control module configured to receive the output signal and perform an operation based on the output signal.

In other features, another optocoupler circuit is provided and includes a first resistor, a second resistor, an optocoupler, a comparator and a feedback loop. The optocoupler includes a light source and a phototransistor. The light source is connected to form a first voltage divider with the first resistor. The phototransistor is connected to form a second voltage divider with the second resistor. The optocoupler transitions an output of the second voltage divider between a first level and a second level. Magnitudes of the first level and the second level are greater than zero. The comparator includes a first input and a second input. The first input receives an output of the first voltage divider. The feedback loop includes a filter. The feedback loop is connected to the second input and the output of the comparator. The filter receives the output of the second voltage divider and provides a reference voltage to the second input of the comparator. The comparator is connected to the output of the second voltage divider, receives the reference voltage and detects a change in the output of the second voltage divider, and based on the change, transitions an output of the comparator between a third level and a fourth level.

In other features, the optocoupler circuit further includes a Zener diode including a cathode. The cathode is connected to the first input of the comparator. In other features, the optocoupler circuit further includes an input transistor connected in series with the light source. In other features, the optocoupler circuit further includes a third resistor connected in series with the light source and the input transistor.

In other features, the input transistor and the third resistor are collectively connected in parallel with the first resistor. In other features, the optocoupler circuit further includes a pull-up resistor connected to the output of the comparator. In other features, the first resistor and the second resistor are connected to different ground reference terminals. In other features, the first voltage divider receives power from a first power source and the second voltage divider receives power from a second power source.

In other features, the filter includes: a third resistor connected to the second input of the comparator and receiving the output of the second voltage divider; and a capacitor connected to the second input and a ground reference terminal.

In other features, the feedback loop includes a third resistor and a fourth resistor connected in series. The third resistor receives the output of the second voltage divider. The fourth resistor is connected to the output of the comparator. In other features, the fourth resistor feeds back at least a portion of the output of the comparator to the second input of the comparator. In other features, a capacitor is connected to the third resistor and the fourth resistor and a ground reference terminal.

In other features, a communication system is provided and includes the optocoupler circuit, a transceiver and a control module. The transceiver is connected to the optocoupler circuit and is configured to communicate with a network device. The control module is connected to the optocoupler circuit and is configured to transmit a first signal to the transceiver or receive a second signal from the receiver via the optocoupler circuit.

In other features, a system is provided and includes: a temperature sensor configured to generate a temperature signal; the optocoupler circuit, where the optocoupler circuit is configured to generate an output signal based on the temperature signal; and a control module configured to receive the output signal and perform an operation based on the output signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 8 is a gain level graph illustrating a trigger level set to account for different optocouplers of a same type.

In the drawings, reference numbers may be reused to identify similar and/or identical elements.

DETAILED DESCRIPTION

Although certain optocouplers are inexpensive, it is not generally feasible to use the low cost optocouplers at high communication speeds (e.g., much above 10-20 kilo-Baud, such as 230 kilo-Baud), especially in low-voltage and low-current communication circuits. As an example, a low-voltage communication circuit may transition between 0 and 3.3 volts (V) when transitioning between LOW and HIGH states. This is due to the delays associated with turning ON and OFF the optocouplers and the large associated parameter variations between different optocouplers of a same type, which are typically accounted for when designing an optocoupler circuit. Some additional speed can be obtained at the expense of significant additional current. For example, if a resistance of a resistor connected in series with the phototransistor of the optocoupler is reduced, then speed is increased, but the amount of current consumed is also increased. Some high-speed isolation devices are available, but these devices tend to be expensive relative to low-speed isolation devices. This cost is multiplied when multiple isolation devices are utilized in, for example, a single circuit and/or on a same circuit board.

A significant amount of delay associated with an optocoupler, occurs when turning ON and OFF the optocoupler. This is referred to as phototransistor turn-ON delay and turn-OFF delay. Some of the turn-OFF delay is associated with the phototransistor being saturated when turned ON. A phototransistor is in a saturated state when the amount (or brightness level) of received light is greater than the amount (or brightness level) associated with the phototransistor being in a fully ON state. Once saturated, the output voltage of the optocoupler does not change or changes minimally with an increase in the amount of received light (or brightness level). This can occur, due to calibration settings to account for component and parameter variations between different optocouplers of a same type.

Figure 5:
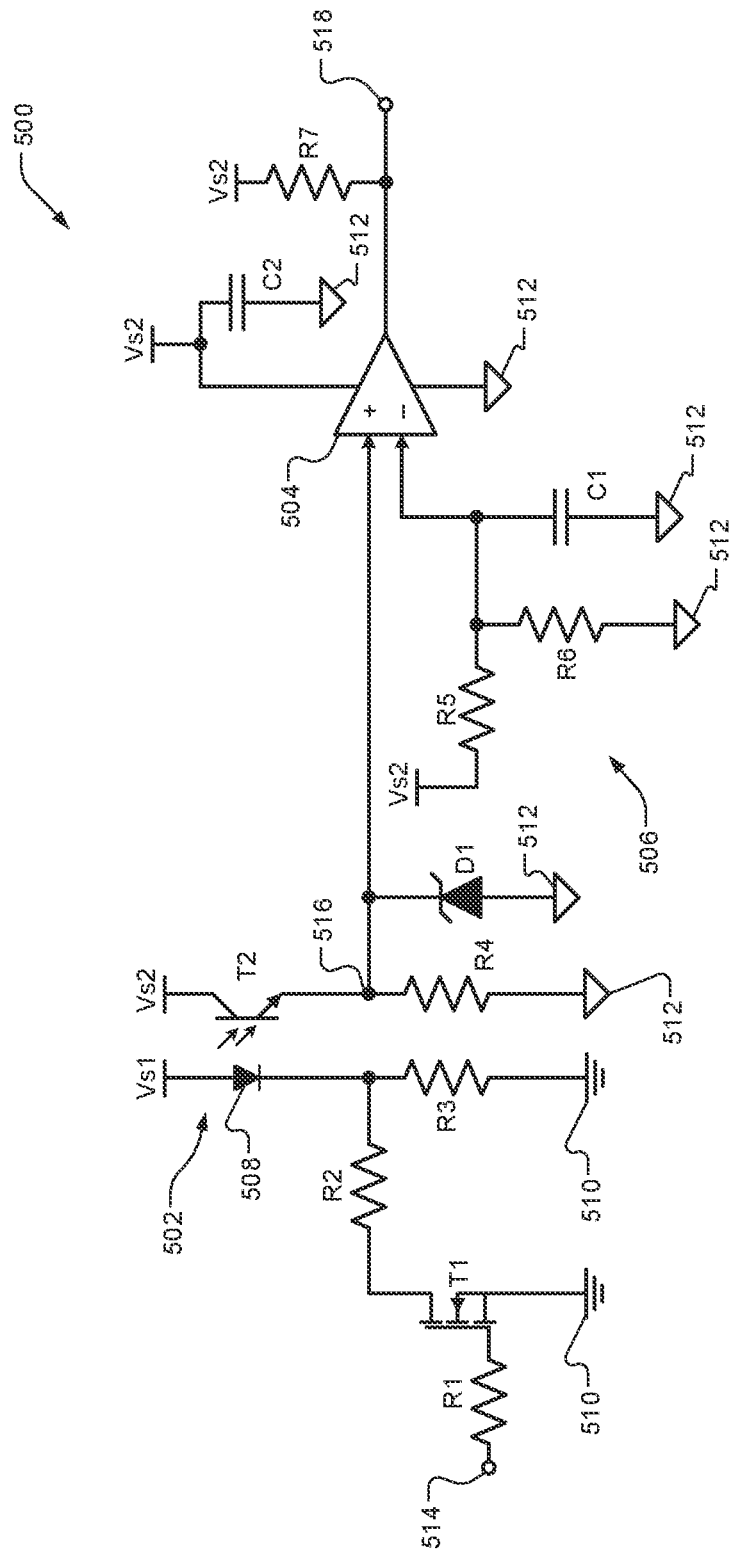
FIG. 5 is a schematic view of an optocoupler circuit having two non-ground operating levels in accordance with the present disclosure.
Figure 6:
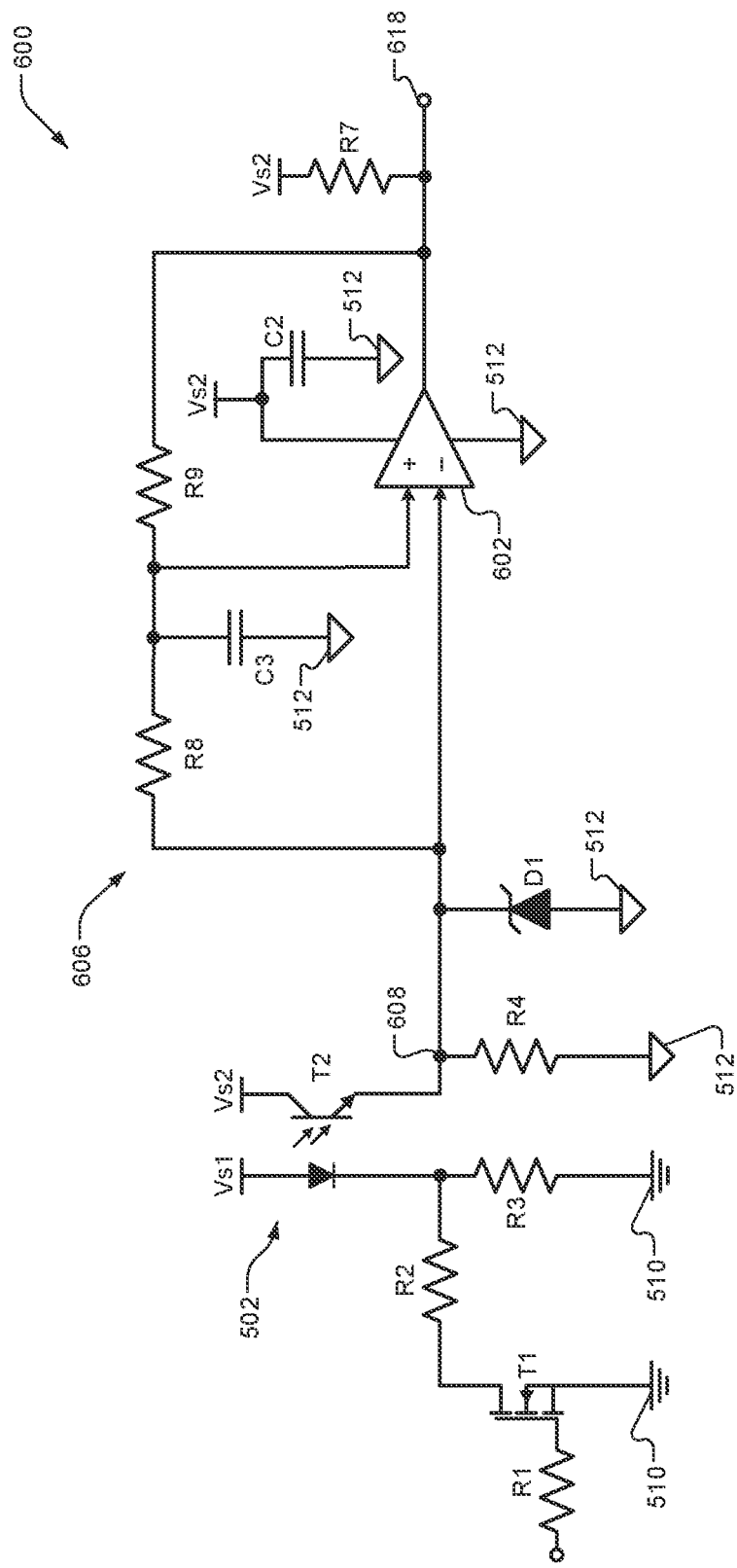
FIG. 6 is a schematic view of another optocoupler circuit with level change detection in accordance with the present disclosure.

The examples set forth herein include high-speed optocoupler circuits that have a minimal number of components and associated cost, but have quick turn ON and OFF transitions. Examples of the high-speed optocoupler circuits (herein after "the optocoupler circuits") are shown in FIGS. 5-6. FIGS. 1-4 and 7 show examples in which the optocoupler circuits may be implemented.

Refrigeration System

Figure 1:
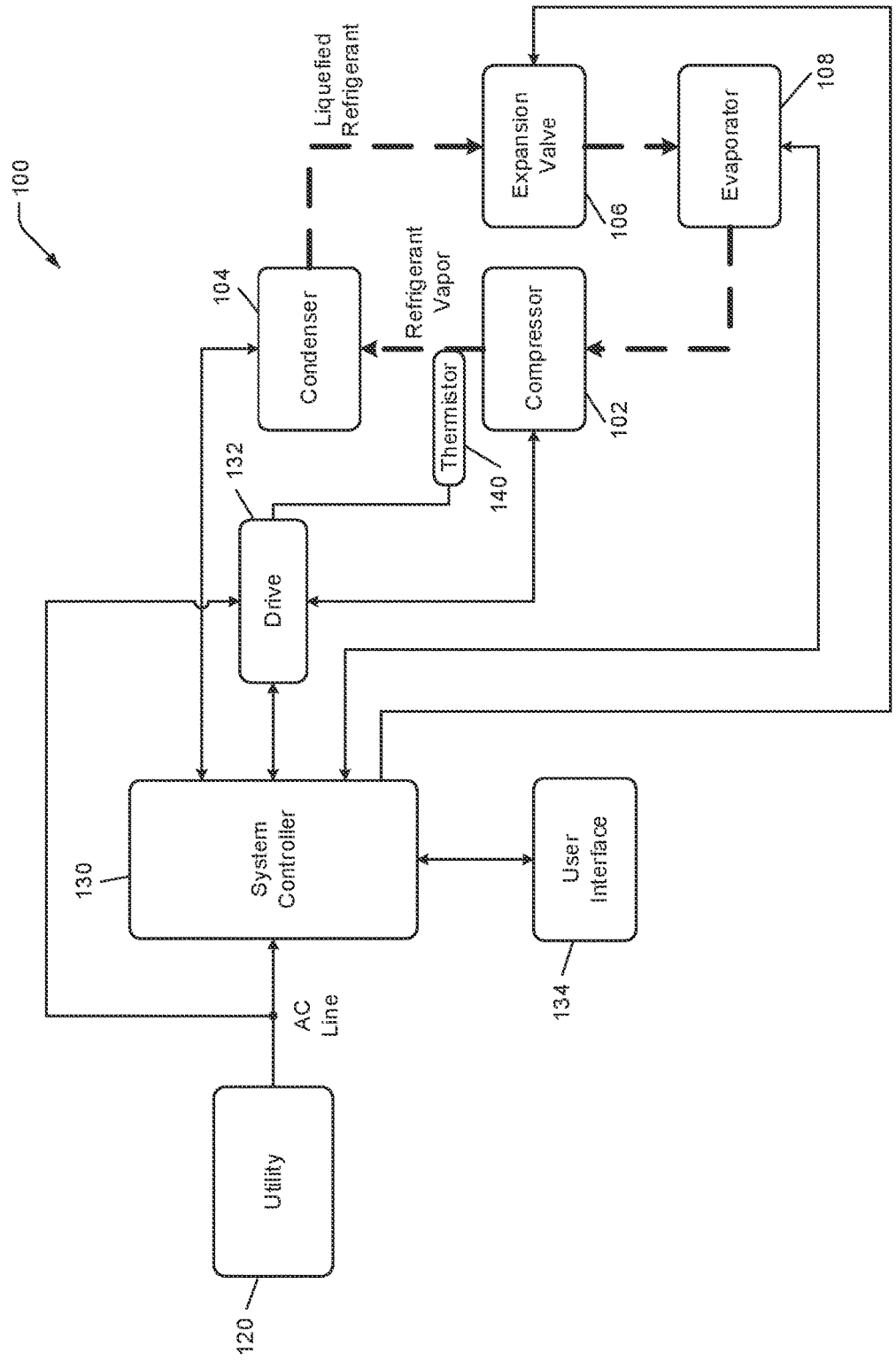
FIG. 1 is a functional block diagram of an example refrigeration system.

FIG. 1 is a functional block diagram of an example refrigeration system 100 including a compressor 102, a condenser 104, an expansion valve 106, and an evaporator 108. According to the principles of the present disclosure, the refrigeration system 100 may include additional and/or alternative components, such as a reversing valve or a filter-drier. In addition, the present disclosure is applicable to other types of refrigeration systems including, but not limited to, heating, ventilating, and air conditioning (HVAC), heat pump, refrigeration, and chiller systems.

The compressor 102 receives refrigerant in vapor form and compresses the refrigerant. The compressor 102 provides pressurized refrigerant in vapor form to the condenser 104. The compressor 102 includes an electric motor that drives a pump. For example only, the pump of the compressor 102 may include a scroll compressor and/or a reciprocating compressor.

All or a portion of the pressurized refrigerant is converted into liquid form within the condenser 104. The condenser 104 transfers heat away from the refrigerant, thereby cooling the refrigerant. When the refrigerant vapor is cooled to a temperature that is less than a saturation temperature, the refrigerant transforms into a liquid (or liquefied) refrigerant. The condenser 104 may include an electric fan that increases the rate of heat transfer away from the refrigerant.

The condenser 104 provides the refrigerant to the evaporator 108 via the expansion valve 106. The expansion valve 106 controls the flow rate at which the refrigerant is supplied to the evaporator 108. The expansion valve 106 may include a thermostatic expansion valve or may be controlled electronically by, for example, a system controller 130. A pressure drop caused by the expansion valve 106 may cause a portion of the liquefied refrigerant to transform back into the vapor form. In this manner, the evaporator 108 may receive a mixture of refrigerant vapor and liquefied refrigerant.

The refrigerant absorbs heat in the evaporator 108. Liquid refrigerant transitions into vapor form when warmed to a temperature that is greater than the saturation temperature of the refrigerant. The evaporator 108 may include an electric fan that increases the rate of heat transfer to the refrigerant.

A utility 120 provides power to the refrigeration system 100. For example only, the utility 120 may provide single-phase alternating current (AC) power at approximately 230 Volts root mean squared ($V_{RMS}$). In other implementations, the utility 120 may provide three-phase AC power at approximately 400 $V_{RMS}$, 480 $V_{RMS}$, or 600 $V_{RMS}$ at a line frequency of, for example, 50 or 60 Hz. When the three-phase AC power is nominally 600 $V_{RMS}$, the actual available voltage of the power may be 575 $V_{RMS}$.

The utility 120 may provide the AC power to the system controller 130 via an AC line, which includes two or more conductors. The AC power may also be provided to a drive 132 via the AC line. The system controller 130 controls the refrigeration system 100. For example only, the system controller 130 may control the refrigeration system 100 based on user inputs and/or parameters measured by various sensors (not shown). The sensors may include pressure sensors, temperature sensors, current sensors, voltage sensors, etc. The sensors may also include feedback information from the drive control, such as motor currents or torque, over a serial data bus or other suitable data buses.

A user interface 134 provides user inputs to the system controller 130. The user interface 134 may additionally or alternatively provide the user inputs directly to the drive 132. The user inputs may include, for example, a desired temperature, requests regarding operation of a fan (e.g., a request for continuous operation of the evaporator fan), and/or other suitable inputs. The user interface 134 may take the form of a thermostat, and some or all functions of the system controller (including, for example, actuating a heat source) may be incorporated into the thermostat.

The system controller 130 may control operation of the fan of the condenser 104, the fan of the evaporator 108, and the expansion valve 106. The drive 132 may control the compressor 102 based on commands from the system controller 130. For example only, the system controller 130 may instruct the drive 132 to operate the motor of the compressor 102 at a certain speed or to operate the compressor 102 at a certain capacity. In various implementations, the drive 132 may also control the condenser fan.

A temperature sensor, such as a thermistor 140, is thermally coupled to the refrigerant line exiting the compressor 102 that conveys refrigerant vapor to the condenser 104. The variable resistance of the thermistor 140 therefore varies with the discharge line temperature (DLT) of the compressor 102. As described in more detail, the drive 132 monitors the resistance of the thermistor 140 to determine the temperature of the refrigerant exiting the compressor 102.

The DLT may be used to control the compressor 102, such as by varying capacity of the compressor 102, and may also be used to detect a fault. For example, if the DLT exceeds the threshold, the drive 132 may power down the compressor 102 to prevent damage to the compressor 102.

Drive

Figure 2:
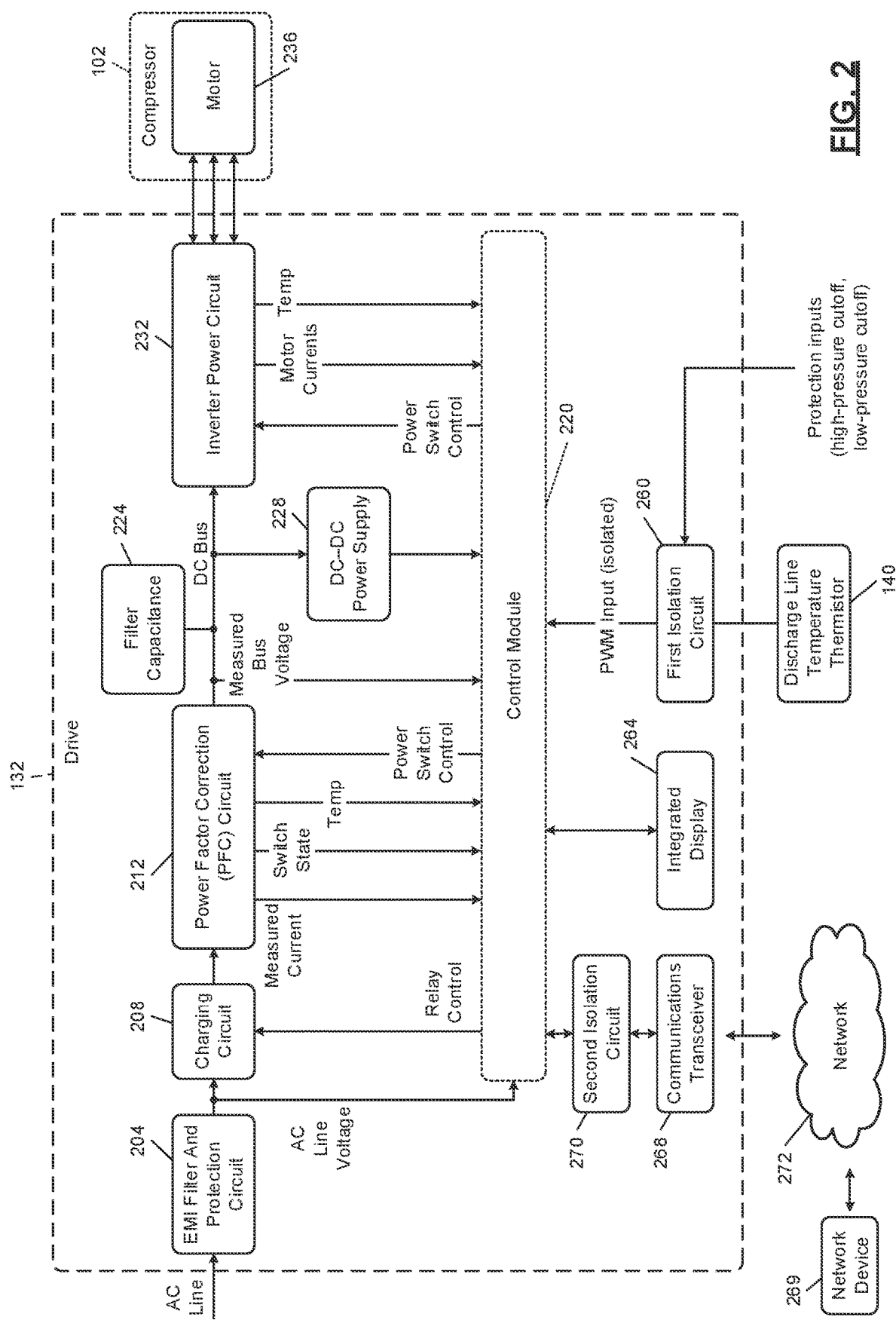
FIG. 2 is a block diagram of an example implementation of the compressor motor drive of FIG. 1 including isolation circuits in accordance with the present disclosure.

In FIG. 2, an example implementation of the drive 132 includes an electromagnetic interference (EMI) filter and protection circuit 204, which receives power from an AC line. The EMI filter and protection circuit 204 reduces EMI that might otherwise be injected back onto the AC line from the drive 132. The EMI filter and protection circuit 204 may also remove or reduce EMI arriving from the AC line. Further, the EMI filter and protection circuit 204 protects against power surges, such as may be caused by lightening, and/or other types of power surges and sags.

A charging circuit 208 controls power supplied from the EMI filter and protection circuit 204 to a power factor correction (PFC) circuit 212. For example, when the drive 132 initially powers up, the charging circuit 208 may place a resistance in series between the EMI filter and protection circuit 204 and the PFC circuit 212 to reduce the amount of current inrush. These current or power spikes may cause various components to prematurely fail.

After initial charging is completed, the charging circuit 208 may close a relay that bypasses the current-limiting resistor. For example, a control module 220 may provide a relay control signal to the relay within the charging circuit 208. In various implementations, the control module 220 may assert the relay control signal to bypass the current-limiting resistor after a predetermined period of time following start up, or based on closed loop feedback indicating that charging is near completion.

The PFC circuit 212 converts incoming AC power to DC power. The PFC circuit 212 may not be limited to PFC functionality—for example, the PFC circuit 212 may also perform voltage conversion functions, such as acting as a boost circuit and/or a buck circuit. In some implementations, the PFC circuit 212 may be replaced by a non-PFC voltage converter. The DC power may have voltage ripples, which are reduced by filter capacitance 224. Filter capacitance 224 may include one or more capacitors arranged in parallel and connected to the DC bus. The PFC circuit 212 may attempt to draw current from the AC line in a sinusoidal pattern that matches the sinusoidal pattern of the incoming voltage. As the sinusoids align, the power factor approaches one, which represents the greatest efficiency and the least demanding load on the AC line.

The PFC circuit 212 includes one or more switches that are controlled by the control module 220 using one or more signals labeled as power switch control. The control module 220 determines the power switch control signals based on a measured voltage of the DC bus, measured current in the PFC circuit 212, AC line voltages, temperature or temperatures of the PFC circuit 212, and the measured state of a power switch in the PFC circuit 212. While the example of use of measured values is provided, the control module 220 may determine the power switch control signals based on an estimated voltage of the DC bus, estimated current in the PFC circuit 212, estimated AC line voltages, estimated temperature or temperatures of the PFC circuit 212, and/or the estimated or expected state of a power switch in the PFC circuit 212. In various implementations, the AC line voltages are measured or estimated subsequent to the EMI filter and protection circuit 204 but prior to the charging circuit 208.

The control module 220 is powered by a DC-DC power supply 228, which provides a voltage suitable for logic of the control module 220, such as 3.3 Volts, 2.5 Volts, etc. The DC-DC power supply 228 may also provide DC power for operating switches of the PFC circuit 212 and an inverter power circuit 232. For example only, this voltage may be a higher voltage than for digital logic, with 15 Volts being one example.

The inverter power circuit 232 also receives power switch control signals from the control module 220. In response to the power switch control signals, switches within the inverter power circuit 232 cause current to flow in respective windings of a motor 236 of the compressor 102. The control module 220 may receive a measurement or estimate of motor current for each winding of the motor 236 or each leg of the inverter power circuit 232. The control module 220 may also receive a temperature indication from the inverter power circuit 232.

For example only, the temperature received from the inverter power circuit 232 and the temperature received from the PFC circuit 212 are used only for fault purposes. In other words, once the temperature exceeds a predetermined threshold, a fault is declared and the drive 132 is either powered down or operated at a reduced capacity. For example, the drive 132 may be operated at a reduced capacity and if the temperature does not decrease at a predetermined rate, the drive 132 transitions to a shutdown state.

The control module 220 may also receive an indication of the discharge line temperature from the compressor 102 using the thermistor 140. A first isolation circuit 260 may provide a pulse-width-modulated representation of the resistance of the thermistor (or temperature sensor) 140 to the control module 220. The first isolation circuit 260 may include galvanic isolation so that there is no electrical connection between the thermistor 140 and the control module 220.

The first isolation circuit 260 may further receive protection inputs indicating faults, such as a high-pressure cutoff or a low-pressure cutoff, where pressure refers to refrigerant pressure. If any of the protection inputs indicate a fault and, in some implementations, if any of the protection inputs become disconnected from the first isolation circuit 260, the first isolation circuit 260 ceases sending the PWM temperature signal to the control module 220. Therefore, the control module 220 may infer that a protection input has been received from an absence of the PWM signal. The control module 220 may, in response, shut down the drive 132.

The control module 220 controls an integrated display 264, which may include a grid of LEDs and/or a single LED package, which may be a tri-color LED. The control module 220 can provide status information, such as firmware versions, as well as error information using the integrated display 264.

The control module 220 communicates with external network devices, such as the system controller 130 in FIG. 1, or other remotely located network devices (e.g., network device 269) using a communications transceiver 268. For example only, the communications transceiver 268 may conform to the RS-485 or RS-232 serial bus standards or to the Controller Area Network (CAN) bus standard. A second isolation circuit 270 may be implemented between the control module 220 and the communications transceiver 268. The communication transceiver 268 may communicate with the network device 269 via a wired and/or wireless communication network 272. The isolation circuits 260, 270 are further described below with respect to FIGS. 4 and 7.

PFC Circuits

Figure 3A:
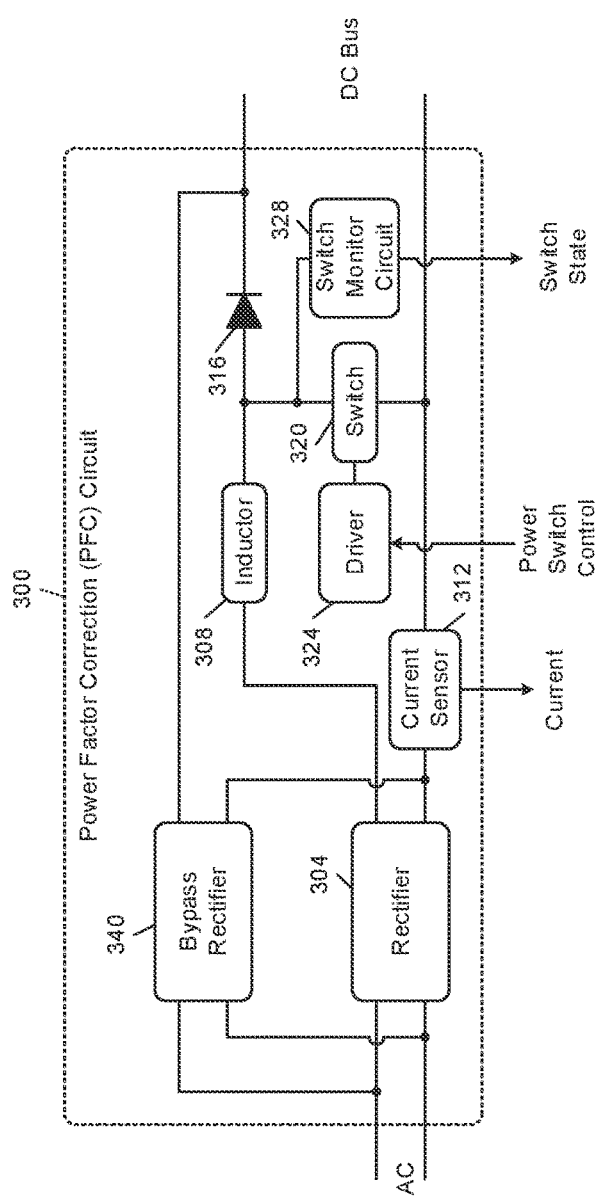
FIG. 3A is a block diagram of an example implementation of the power factor correction (PFC) circuit of FIG. 2.

In FIG. 3A, a PFC circuit 300 is one implementation of the PFC circuit 212 of FIG. 2. The PFC circuit 300 includes a rectifier 304 that converts incoming AC into pulsating DC. In various implementations, the rectifier 304 includes a full-wave diode bridge. The DC output of the rectifier 304 is across first and second terminals. The first terminal is connected to an inductor 308, while the second terminal is connected to a current sensor 312. An opposite end of the inductor 308 is connected to a node that is common to the inductor 308, an anode of a diode 316, and a first terminal of a switch 320.

The PFC circuit 300 generates a DC bus, where a first terminal of the DC bus is connected to a cathode of the diode 316 while a second terminal of the DC bus is connected to the second output terminal of the rectifier 304 via the current sensor 312. The current sensor 312 can, therefore, sense the current within the switch 320 as well as the current in the DC bus and current in the inductor 308. The second terminal of the DC bus is also connected to a second terminal of the switch 320.

A driver 324 receives the power switch control signal from the control module 220 of FIG. 2 and rapidly charges or discharges a control terminal of the switch 320. For example, the switch 320 may be a field effect transistor with a gate terminal as the control terminal. More specifically, the switch 320 may be a power metal-oxide-semiconductor field-effect transistor (MOSFET), such as the STW38N65M5 power MOSFET from STMicroelectronics. The driver 324, in response to the power switch control signal, charges or discharges the capacitance at the gate of the field effect transistor.

A switch monitor circuit 328 measures whether the switch is ON or OFF. This closed loop control enables the control module 220 to determine whether the switch 320 has reacted to a command provided by the power switch control signal and may also be used to determine how long it takes the switch 320 to respond to that control signal. The measured switch state is output from the switch monitor circuit 328 back to the control module 220. The control module 220 may update its control of the power switch control signal to compensate for delays in turning on and/or turning off the switch 320.

In FIG. 3A, the inductor, the switch 320, and the diode 316 are arranged in a boost configuration. In brief, the switch 320 closes, causing current through the inductor 308 to increase. Then the switch 320 is opened, but the current through the inductor 308 cannot change instantaneously because the voltage across an inductor is proportional to the derivative of the current. The voltage across the inductor 308 becomes negative, meaning that the end of the inductor 308 connected to the anode of the diode 316 experiences a voltage increase above the voltage output from the rectifier 304.

Once the voltage at the anode of the diode 316 increases above the turn-on voltage of the diode 316, the current through the inductor 308 can be fed through the diode 316 to the DC bus. The current through the inductor 308 decreases and then the switch 320 is closed once more, causing the current and the inductor 308 to increase.

In various implementations, the switch 320 may be turned on until the current sensor 312 determines that a predetermined threshold of current has been exceeded. At that time, the switch 320 is turned off for a specified period of time. This specified period may be adaptive, changing along with the voltage of the DC bus as well as the voltage of the AC input change. However, the off time (when the switch 320 is open) is a specified value. Once a time equal to the specified value has elapsed, the switch 320 is turned back on again and the process repeats. The off time can be fixed or variable. In the case of the off time being variable, the off time can be limited to at least a predetermined minimum off time.

To reduce the physical size and parts cost of the PFC circuit 300, the inductance of the inductor 308 (which may be the largest contributor to the physical size of the PFC circuit 300) may be lowered. However, with a lower inductance, the inductor 308 will saturate more quickly. Therefore, the switch 320 will have to operate more quickly. While more quickly and smaller are relative terms, present power switching control operates in the range of 10 kilohertz to 20 kilohertz switching frequencies. In the present application, the switching frequency of the switch 320 may be increased to more than 50 kilohertz, more than 100 kilohertz, or more than 200 kilohertz. For example, the switching frequency of the switch may be controlled to be approximately 200 kilohertz.

The switch 320 is therefore chosen to allow for faster switching as well as to have low switching losses. With faster switching, the inductance of the inductor 308 can be smaller. In addition, the diode 316 may need to be faster. Silicon carbide diodes may have fast response times. For example, the diode 316 may be an STPSC2006CW Silicon Carbide dual diode package from STMicroelectronics.

In order to accurately drive the switch 320 when operating at higher speeds, the control strategy must similarly be accelerated. For example only, the control module 220 may include multiple devices, such as a microcontroller configured to perform more involved calculations and an FPGA (field programmable gate array) or PLD (programmable logic device) configured to monitor and respond to inputs in near real time. In this context, near real time means that the time resolution of measurement and time delay in responding to inputs of the FPGA or PLD is negligible compared to the physical time scale of interest. For faster switching speeds, the near real time response of the FPGA/PLD may introduce non-negligible delays. In such cases, the delay of the FPGA/PLD and driving circuitry may be measured and compensated for. For example, if the turn-off of a switch occurs later than needed because of a delay, the turn-off can be instructed earlier to compensate for the delay.

A bypass rectifier 340 is connected in parallel with the rectifier 304 at the AC line input. A second output terminal of the bypass rectifier 340 is connected to the second terminal rectifier 304. However, a first output terminal of the bypass rectifier 340 is connected to the cathode of the diode 316.

As a result, when the PFC circuit 300 is not operating to boost the DC bus voltage, the bypass rectifier 340 will be active when the line-to-line voltage of the AC input exceeds the voltage across the DC bus. The bypass rectifier 340, in these situations, diverts current from passing through the diode 316. Because the inductor 308 is small, and the switch 320 switches rapidly, the diode 316 is also selected to exhibit fast switching times. The diode 316 may, therefore, be less tolerant to high currents, and so current is selectively shunted around the diode 316 by the bypass rectifier 340.

In addition, the current path through the rectifier 304 and the diode 316 experiences three diode voltage drops or two diode voltage drops and the switch voltage drop, while the path through the bypass rectifier 340 experiences only two diode voltage drops. While the single phase AC input in FIG. 3A is associated with a boost converter topology, the present disclosure also encompasses a buck converter topology or a buck-boost converter topology.

Figure 3B:
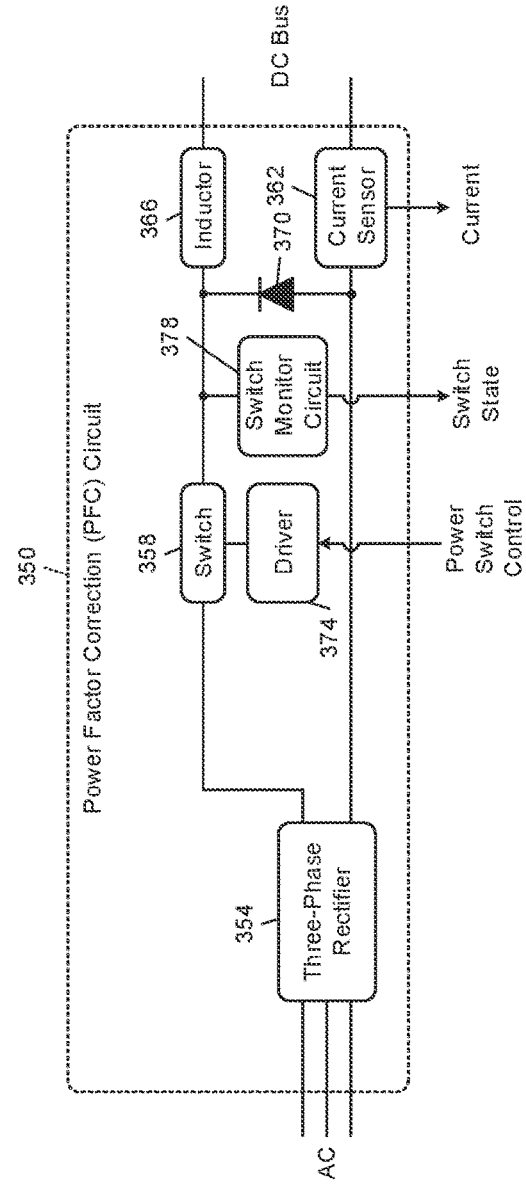
FIG. 3B is a block diagram of another example implementation of the PFC circuit of FIG. 2.

In FIG. 3B, a buck converter topology is shown with a three-phase AC input signal. Note that the principles of the present disclosure also apply to a boost converter or buck-boost converter topology used with a three-phase AC input. A PFC circuit 350 represents another implementation of the PFC circuit 212 of FIG. 2.

A three-phase rectifier 354 receives three-phase AC and generates pulsating DC across first and second terminals. A switch 358 is connected between the first terminal of the three-phase rectifier 354 and a common node. The common node is connected to an inductor 366 and a cathode of a power diode 370.

An anode of the power diode 370 is connected to a second terminal of the three-phase rectifier 354. An opposite terminal of the inductor 366 establishes one terminal of the DC bus, while the second output of the three-phase rectifier 354 establishes the other terminal of the DC bus. In the configuration shown in FIG. 3B, the switch 358, the inductor 366, and the diode 370 are configured in a buck topology.

A current sensor 362 is connected in series between the anode of the diode 370 and the DC bus. In other implementations, the current sensor 362 may be located in series with the inductor 366. In other implementations, the current sensor 362 may be located in series with the switch 358. In other implementations, the current sensor 362 may be located in series between the anode of the diode 370 and the second output of the three-phase rectifier 354. The current sensor 362 measures current through the inductor 366 as well as current through the DC bus and provides a current signal indicative of the amount of the current.

A driver 374 drives a control terminal of the switch 358 based on a power switch control signal from the control module 220 in FIG. 2. A switch monitor circuit 378 detects whether the switch 358 has opened or closed and reports the switch state to the control module 220. With the location of the current sensor 362, the current sensor 362 will measure approximately zero current when the switch 358 is open.

Figure 4:
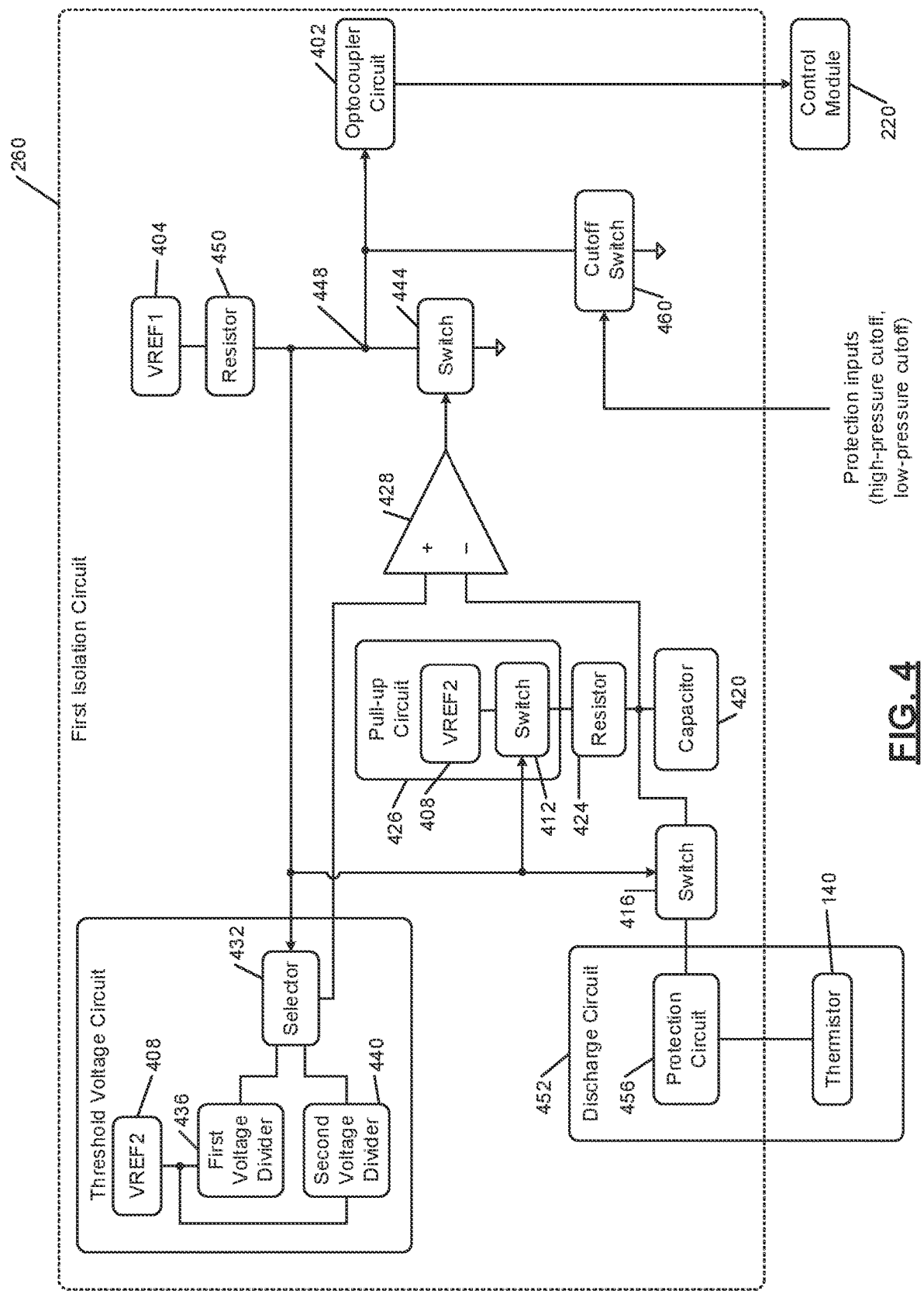
FIG. 4 is a functional block diagram of an example implementation of the isolation circuit including an optocoupler in accordance with the present disclosure.

Referring now also to FIG. 4, which shows an example implementation of the first isolation circuit 260. The first isolation circuit 260 of the present disclosure charges a capacitor via a pull-up resistor and discharges the capacitor via the thermistor 140. The first isolation circuit 260 charges the capacitor to a first predetermined value, then discharges the capacitor to a second predetermined value, then charges the capacitor to the first predetermined value, and so on.

Using an optocoupler circuit 402 or another type of isolation barrier, the first isolation circuit 260 transmits a pulse width modulation (PWM) signal to the control module 220. Optocouplers can also be referred to as opto-isolators. The state of the PWM signal indicates whether the capacitor is charging or discharging. Based on the PWM signal, the control module determines a charging period of the capacitor and a discharge period of the capacitor. The charging period of the capacitor corresponds to the period to charge the capacitor up to the first predetermined value. The discharge period corresponds to the period to discharge the capacitor down to the second predetermined value.

A ratio of the charge period to the discharge period is approximately equal to or equal to a ratio of the resistance of the pull-up resistor to the combined resistance of the thermistor 140 and other discharge circuit components. A duty cycle of the PWM signal corresponds to the ratio of the charging period of the capacitor to the discharge period of the capacitor. Based on the equivalence of these two ratios and knowledge of the resistance of the other discharge circuit components, the control module determines a resistance of the thermistor 140.

The resistance of the thermistor 140 is directly related to temperature measured by the thermistor 140, such as compressor discharge line temperature (DLT). For the example of the thermistor 140 being a negative temperature coefficient (NTC) thermistor, the resistance of the thermistor 140 may decrease as the temperature of the thermistor 140 increases, and vice versa. While the example of a NTC thermistor will be described, the present application is also applicable to a positive temperature coefficient (PTC) thermistor where resistance decreases as temperature decreases, and vice versa. Also, while the example of a thermistor is described, the present application is also applicable to other types of variable resistance sensors (e.g., pressure sensors). The control module 220 determines the temperature measured by the thermistor 140, for example, based on the duty cycle of the PWM signal (the ratio of the charge period to the discharge period). The temperature measured by the thermistor 140 can therefore be sensed across the isolation barrier provided by the optocoupler circuit 402.

The first isolation circuit 260 utilizes a first reference voltage (VREF1) 404 and a second reference voltage (VREF2) 408. The first reference voltage 404 may be greater than the second reference voltage 408. For example, the first reference voltage 404 may be approximately 3.3 V, and the second reference voltage 408 may be approximately 2.5 V. Other suitable reference voltages may be used. For example, the first reference voltage 404 and the second reference voltage 408 may be approximately equal. The use of approximately voltage thresholds that are derived from the same reference voltage, such as the second reference voltage 408, may decrease the number of mathematical calculations performed relative to the use of voltage thresholds derived from different reference voltages. The first reference voltage 404 and/or the second reference voltage 408 may be provided by an isolated supply.

A charge switch 412 and a discharge switch 416 are alternately switched such that one of the charge switch 412 and the discharge switch 416 is in a closed (conducting) state when the other one of the charge switch 412 and the discharge switch 416 is in an open (non-conducting) state. For example, the second reference voltage 408 charges a capacitor 420 via a pull-up resistor 424 when the charge switch 412 is in the closed state. When the charge switch 412 is in the closed state, the discharge switch 416 is in the open state. The second reference voltage 408 and the pull-up resistor form a pull-up circuit 426.

A voltage of the capacitor 420 increases during charging. The voltage of the capacitor 420 decreases during discharging. The voltage of the capacitor 420 is connected to a first input terminal of a comparator 428.

A selector 432 selects one of: a first voltage divider 436 and a second voltage divider 440. In various implementations, the first voltage divider 436 and the second voltage divider 440 may share one or more components. When selected by the selector 432, the first voltage divider 436 converts the second reference voltage 408 into a first voltage threshold and applies the first voltage threshold to a second input terminal of the comparator 428. Similarly, the second voltage divider 440, when selected by the selector 432, converts the second reference voltage 408 into a second voltage threshold and applies the second voltage threshold to the second input terminal of the comparator 428.

The first voltage threshold is greater than the second voltage threshold. For example only, the first voltage divider 436 may be configured to generate the first voltage threshold at approximately 0.6*the second reference voltage 408. The second voltage divider 440 may be configured to generate the second voltage threshold at approximately 0.4*the second reference voltage 408.

The capacitor 420 is charged to the first voltage threshold during charging and discharged to the second voltage threshold during discharging. The comparator 428 compares the voltage of the capacitor 420 with the first voltage threshold during charging of the capacitor 420. When the voltage of the capacitor 420 becomes greater than the first voltage threshold, the comparator 428 transitions its output from a first state to a second state.

The output of the comparator 428 controls switching of an output switch 444. More specifically, the output of the comparator 428 is applied to a control terminal (e.g., gate terminal) of the output switch 444. When the output of the comparator 428 is in the second state, the output switch 444 is in an open state and creates an open circuit between its first terminal and ground. Ground may refer to a reference ground potential or an actual ground potential. When the output switch 444 is in the open state, a node 448 connected to the first terminal of the output switch 444 is connected to the first reference voltage 404 via a pull-up resistor 450.

The optocoupler circuit 402 is connected to the node 448 and therefore generates an output based on the first reference voltage 404 when the output switch 444 is in the open state. The period that the optocoupler circuit 402 generates its output based on the first reference voltage 404 corresponds to the period to discharge the capacitor 420 to the second voltage threshold.

Based on the first reference voltage 404 at the node 448, the charge switch 412 is in the open state (to prevent charging of the capacitor 420) and the discharge switch 416 is in the closed state (to discharge the capacitor 420). The selector 432 also selects the second voltage divider 440 based on voltage based on the first reference voltage 404 being present at the node 448.

When the comparator 428 transitions its output from the second state to the first state, the output switch 444 transitions from the open state to the closed state. When the output switch 444 is in the closed state, the output switch 444 connects its first terminal to its second terminal, thereby connecting the node 448 to ground.

The optocoupler circuit 402 therefore generates the output based on ground when the output switch 444 is in the closed state. The output of the optocoupler circuit 402 is therefore a PWM signal that transitions between a voltage based on the first reference voltage 404 and ground based on whether the capacitor is charging or discharging. The control module 220 determines the temperature of the thermistor 140 based on a duty cycle of the PWM signal. The period that the optocoupler circuit 402 generates its output based on ground corresponds to the period to charge the capacitor 420 to the first voltage threshold, which is derived from the second reference voltage 408 using the second voltage divider 440.

Based on the node 448 being grounded, the charge switch 412 is in the closed state (to charge the capacitor 420) and the discharge switch 416 is in the closed state (to prevent discharging of the capacitor 420). The selector 432 also selects the first voltage divider 436 based on ground being present at the node 448. When the voltage of the capacitor 420 is less than the second voltage threshold, the comparator 428 transitions its output from the second state to the first state. This process of switching back and forth between charging and discharging the capacitor 420 continues.

The capacitor 420 discharges to the thermistor 140 and one or more other components of a discharge circuit 452 via the discharge switch 416. For example, the discharge circuit 452 may include one or more protection circuit components 456 and/or other circuit components. The protection circuit components 456 may, for example, limit the discharge period of the capacitor 420 to a predetermined maximum period, such as when the thermistor 140 is cold and the resistance of the thermistor 140 is therefore high in the example of the thermistor 140 being an NTC thermistor.

The resistance of the thermistor 140 varies with temperature measured by the thermistor 140. For example only, the thermistor 140 may measure a DLT of the compressor 102 or another temperature of the system 100.

The control module 220 receives the signals from the optocoupler circuit 402. The control module 220 measures the period between when the optocoupler circuit 402 begins generating its output based on the node 448 being connected to the first reference voltage 404 and when the optocoupler circuit 402 next begins generating its output based on the node 448 being connected to ground. This period is the discharge period of the capacitor 420. The control module 220 also measures the period between when the optocoupler circuit 402 begins generating its output based on the node 448 being connected to ground and when the optocoupler circuit 402 next begins generating its output based on the node 448 being connected to the first reference voltage 404. This period is the charging period of the capacitor 420.

A ratio of the charging period of the capacitor 420 to the discharge period of the capacitor 420 is equal to or approximately equal to a ratio of the resistance of the pull-up resistor 424 to the combined resistance of the thermistor 140 and other components of the discharge circuit 452. This equivalence is expressed by the equation below.

Charging Period/Discharge Period=$R/R(T\&OC)$,

Discharge Period $R(T\&OC)'$ where Charging Period is the charging period of the capacitor 420, Discharge Period is the discharge period of the capacitor 420, R is the resistance of the pull-up resistor 424 through which the capacitor 420 is charged, and R(T&OC) represents the combined resistance determined based on the resistance of the thermistor 140 (T) and the resistance of the other components (OC) of the discharge circuit 452. This relationship is true for the use of voltage dividers that are balanced, such as the balance of the 0.4× and 0.6× the second reference voltage 408 (relative to 0.5× the second reference voltage 408) provided by the first and second voltage dividers 436 and 440. The present application, however, is also applicable to the use of non-balanced voltage thresholds. In the example of non-balanced voltage thresholds, the right side of the above relationship may be different (e.g., the numerator and denominator may be multiplied by constants) based on the voltage thresholds used.

The resistance of the other components of the discharge circuit 452 is a fixed predetermined resistance. The control module 220 determines the resistance of the thermistor 140 based on the charging period of the capacitor 420, the discharging period of the capacitor 420, and the predetermined resistance of the other components of the discharge circuit 452 by solving the relationship above for the resistance of the thermistor 140.

As stated above, the resistance of the thermistor 140 is related to the temperature measured by the thermistor 140. The control module 220 determines the temperature of the thermistor 140 based on the resistance of the thermistor 140. For example, the control module 220 may determine the temperature of the thermistor 140 using one of a function and a look-up table that relates resistances of the thermistor 140 to temperatures of the thermistor 140. In the example of using a look-up table, the control module 220 may determine the temperature of the thermistor 140 using interpolation (e.g., linear) when the resistance of the thermistor 140 is between entries of the look-up table.

The first isolation circuit 260 may also include one or more cutoff switches, such as cutoff switch 460. Protection inputs of the first isolation circuit 260, such as a low-pressure cutoff signal, a high pressure cutoff signal, and other protection signals may be applied to a control terminal of the cutoff switch 460. When a low-pressure cutoff, a high pressure cutoff, or another protection event is signaled, the cutoff switch 460 connects the node 448 to ground. This clamps the input to the optocoupler circuit 402 to ground. The lack of a PWM like output from the optocoupler circuit 402 may therefore indicate a problem, such as a lack of communication from the optocoupler circuit 402 or a high pressure cutout. Instead of using cutoff switches, a corresponding capacitor may be changed due to one of the protection signals and as a result an overall period is changed, which still allows the thermistor to be read.

To reduce turn-ON delay and turn-OFF delay of optocouplers implemented in the isolation circuits 260, 270 of FIG. 2, the optocoupler circuits may be implemented as shown in FIGS. 5-6. In one embodiment, the optocoupler circuit 402 of FIG. 4 is implemented as the optocoupler circuit 500 of FIG. 5. The phototransistors of the optocouplers of FIGS. 4-5 are maintained in a linear operating range to minimize and/or eliminate the turn-ON and turn-OFF delays.

FIG. 5 shows the optocoupler circuit 500 having two non-ground reference operating levels. In one embodiment, the optocoupler circuit 500 has two positive or non-zero (or non-ground) operating levels; a HIGH level (e.g., 2.6V) and a LOW level (e.g., 0.5V). The optocoupler circuit 500 includes an optocoupler 502, a comparator 504, and a reference circuit 506 and may include an input transistor T1 and a pull-up resistor R7. The optocoupler circuit 500 includes a light source (e.g., LED) 508 and a phototransistor T2, which receive respectively a predetermined first power supply voltage Vs1 (e.g., 3.3 V) and a predetermined second power supply voltage Vs2 (e.g., same or different voltage than Vs1). The light source 508 and the phototransistor T2 are connected in series with resistors R3 and R4, respectively. An input resistor R1 may be connected to a gate of the transistor T1. The drain of the transistor T1 is connected to a second resistor R2, which is connected to the light source 508 and the resistor R3. The source of the transistor T1 and the resistor R3 are connected to a first ground (or reference) terminal 510. The resistor R4 is connected to a second ground (or reference) terminal 512.

The transistor T1 is included to reduce variation in driving the light source 508. In one embodiment, the transistor is not included. The transistor T1 may not be included depending on the source of the signal provided to the input 514 of the optocoupler circuit 500 and parameter tolerances. If the state of the signal is stable and known, the resistance values of the optocoupler circuit 500 may be set appropriately and the transistor T1 may not be used, such that the input signal is provided directly to the resistor R2.

The light source 508 and the resistor R3 operate as a first voltage divider, when the transistor T1 is in an open state and the optocoupler 502 is in the LOW state. While in the LOW state, the light source 508 is in a first illuminated state. The light source 508 and the resistors R2 and R3 operate as a second voltage divider when the transistor T1 is in a closed state and the optocoupler 502 is in a HIGH state. While in the HIGH state, the light source 508 is in a second illuminated state. The second illuminated state is brighter than the first illuminated state. The resistances R2 and R3 are selected, such that the phototransistor T2 is not in an OFF state and is not saturated at any operational moment in time. The value of the resistor R3 is set such that the light source 508 is in a partially ON state at any moment in time and transitions between a LOW partially ON state and a HIGH partially ON state. In one embodiment, the resistances of the resistors R2 and R3 are selected such that when the phototransistor T2 is in the HIGH state, the phototransistor is not fully ON and/or at a point above which the phototransistor T2 is saturated.

The comparator 504 is used to allow the optocoupler circuit 500 to be implemented in a low voltage environment, such as when the voltage sources Vs1, Vs2 are at 3.3.V. This allows the output voltage of the optocoupler circuit 500 to be switched between, for example, 0 and 3.3.V rather than between two intermediary voltages (e.g., 0.4V and 2.5V), which are between 0 and 3.3.V. This makes the optocoupler circuit 500 compatible with other logic circuits. The comparator 504 is an inexpensive solution that is used to set a detection (or trigger) level for transitioning between the LOW and HIGH states and is more precise and flexible than using a typical logic gate input of a logic circuit.

Different phototransistors of a same type can have different gains for the same drive current due to product parameter variations. As an example, FIG. 8 shows HIGH and LOW voltage states for two different phototransistors of a same type. One of the phototransistors may be considered good (e.g., new, not degraded and/or operating at higher gain levels) and the other phototransistor may be considered poor (e.g., used, aged, degraded, and/or operating at lower gain levels). The gain of an optocoupler degrades over a lifetime of the optocoupler. Also, the gain of an optocoupler changes with temperature changes. As shown, the good phototransistor may have at HIGH gain state that is higher than a HIGH gain state of the poor phototransistor. Similarly, the good phototransistor may have a LOW gain state that is higher than a LOW gain state of the poor phototransistor.

To account for the possible states of the good and poor phototransistors, a trigger level may be selected between the HIGH gain level of the poor phototransistor and the LOW gain level of the good phototransistor. The trigger level refers to the level at which to switch between the LOW and HIGH states. As an example, a reference voltage provided to the inverting input of the comparator 504 may be set at the trigger level via the reference circuit 506. The comparator 504 is shown as an operational amplifier. The operating band over which the phototransistor T2 is as a result operated in may be narrow. This is especially true due to the exponential nature of the output of the optocoupler 502.

Also, although it is desirable to set the trigger level half way between the HIGH gain level of the poor phototransistor and the LOW gain level of the good phototransistor, doing so can result in the trigger level not being half way between the HIGH gain level and the LOW gain level of the actual phototransistor T2 that is in use. This can result in the turn-ON and turn-OFF delays being different and one of the delays being weighted more heavily (i.e. having more time constants of delay) than the other. As a result the turn-ON delay may be longer or the turn-OFF delay may be longer and thus the quickest response may not be provided for transitioning ON or for when transitioning OFF. As an example, a mismatch between ON and OFF delay times may be 20-200 micro-seconds (μs) depending on the resistances of the resistors and the loads. To overcome these issues and provide quick response for both turn ON and turn OFF conditions, a Zener diode D1 is added, which allows the HIGH level of the light source 508 to be increased without saturating the phototransistor T2. The Zener diode D1 allows the resistance of the resistor R4 to be increased and limits the HIGH level or voltage across the phototransistor by allowing more current through the resistor R4. This prevents the phototransistor T2 from saturating and allows the voltage across the resistor R4 to rise. Put another way, the Zener diode D1 limits how low voltage across the phototransistor D1 drops, which allows more current to pass through the resistor R4. This allows the gap between the HIGH gain level of the poor phototransistor and the LOW gain level of the good phototransistor to increase, which provides more flexibility as to which level to select as the trigger level. The Zener diode D1 allows for a larger operating band of a high gain optocoupler while using less current and avoiding turn-on and turn-off delays. The trigger level may be moved and centered in the larger band, which reduces variation and delay.

A terminal 516 between the phototransistor T2 and the resistor R4 is connected to a non-inverting input of the comparator 504. The Zener diode D1 is connected between the non-inverting input and the second ground terminal 512, where the cathode of the Zener diode D1 is connected to the non-inverting input and the terminal 516.

The reference circuit 506 includes a resistor R5 receiving the voltage Vs2 and connected to resistor R6 and capacitor C1, which are connected in parallel. The resistors R5, R6 and the capacitor C1 are connected to the inverting input of the comparator 504. The resistor R6 and the capacitor C1 are also connected to the second ground terminal 512. The values of the resistors R5, R6 and capacitor C1 are selected to set the appropriate reference (or trigger level) for transitioning between HIGH and LOW states. This may be done while accounting for different possible versions of the optocoupler 502 having different amounts of gain. A power source input of the comparator 504 is connected to capacitor C2 and to receive the voltage Vs2. The capacitor C2 and comparator 504 are also connected to the second ground terminal 512.

The output of the comparator 504 may be connected to the pull-up resistor R7, which receives the voltage Vs2. The output of the comparator 504 is provided to an output terminal 518. The comparator 504 and/or the pull-up resistor R7 may be connected to a different power source than the power source supplying Vs2 and/or receive a different power source voltage (e.g., Vs3). For example, the voltage Vs2 may be 3.3V and the comparator 504 and/or the pull-up resistor R7 may be connected to a 5V power source terminal.

The example of FIG. 5 provides improved transition speeds allowing for use in a communication system and/or other system where quicker transitions needed. The example of FIG. 5 eliminates a significant amount of delay, but there remains some delay while the output voltage of the phototransistor T2 is changing until the trigger level is reached and the comparator 504 changes state. This delay limits maximum bit rate directly. Also, if the trigger level is not centered between HIGH and LOW levels (or the rising and falling edges of the input signal), then switching is more delayed in one direction (for turn ON or turn OFF) than in the other direction (the other one of the turn ON and turn OFF transitions).

For high-speed communication at rates for example of 230kBaud or 500kBaud, setting a fixed trigger level for the optocoupler circuit 500 that is at the correct level for all possible situations is difficult due to component parameter variations and in certain situations may not be feasible. The optocoupler circuit 600 of FIG. 6 overcomes this issue and allows for the stated high-speed communication by detecting when a change occurs in voltage at an output of an optocoupler and responding by transitioning an output of the optocoupler circuit between HIGH and LOW states. This is done rather than detecting an absolute value of the voltage and responding to the detected absolute value. Detecting and responding to changes in voltage levels allows the setting of a trigger level that is close to a current output voltage of the optocoupler (or opto-transistor) independent of whether the current output voltage is HIGH or LOW and independent of the gain of the optocoupler. This reduces response time to a minimum and allows reliable communication at significantly faster speeds (an order of magnitude faster than that possible with a basic optocoupler circuit).

The optocoupler circuit 600 includes the optocoupler 502, a comparator 602, and a feedback loop 606 and may include the input switch T1 and the pull-up resistor R7. The optocoupler 502 is connected to the resistors R2, R3 and R4, as described above. The resistor R2 may be connected to the transistor T1 and resistor R1, as described above or may directly receive an input signal. As with the example of FIG. 5, the transistor T1 in FIG. 6 reduces variation in the light source drive and may not be utilized depending on the source of the input signal and other parameter tolerances.

Terminal 608 is connected between the phototransistor T2 and the resistor R4 and to the inverting input of the comparator 602. A cathode of the Zener diode D1 is connected to the terminal 608, the inverting input of the comparator 602 and to a resistor R8. The anode of the Zener diode D1 is connected to the second ground terminal 512.

Resistors R8, R9 are connected in series between a non-inverting input and an output of the comparator 602 and form the feedback loop 606. A first end of capacitor C3 is connected to the resistors R8, R9 and the non-inverting input of the comparator 602. A second end of the capacitor C3 is connected to the second ground terminal 512. A power source input of the comparator 602 is connected to receive the voltage Vs2 and to capacitor C2, which is connected to the second ground terminal 512. The comparator 602 is also connected to the second ground terminal 512. The output of the comparator 602 may be connected to the pull-up resistor R7, which receives the voltage Vs2. The output of the comparator 602 is provided to an output terminal 618. The comparator 602 and/or the pull-up resistor R7 may be connected to a different power source than the power source supplying Vs2 and/or receive a different power source voltage (e.g., Vs3). For example, the voltage Vs2 may be 3.3V and the comparator 602 and/or the pull-up resistor R7 may be connected to a 5V power source terminal.

The feedback loop 606 provides a feedback reference level close to the level of the inverting input of the comparator 602. The comparator 602 detects a change in voltage at the inverting input (or output of the optocoupler) and provides an inverted output and the output of the comparator 602 transitions between HIGH and LOW levels based on the detected change.

The voltage at the non-inverting input of the comparator 602 is a filtered delayed version of the voltage at the inverting input. The resistor R8 and the capacitor C3 provide the filter. As a result the voltage provided to the non-inverting input is delayed and is at least initially less than (or greater than depending on which way up the signal is at the time) the voltage provided at the inverting input. The voltage at the non-inverting input tracks the voltage at the inverting input. At steady-state the voltage at the non-inverting input may be slightly different than the voltage at the inverting input. The values of the resistor R8, the capacitor C3 and the resistor R9 are selected to set the appropriate reference (or trigger level) for transitioning between HIGH and LOW states. This may be done while accounting for different possible versions of the optocoupler 502 having different amounts of gain.

At a LOW level input to the comparator 602, the voltage at the non-inverting input is slightly above the voltage at the inverting input, such that the output of the comparator 602 is HIGH, when in a normal stable state, but may be otherwise if disrupted before correcting on next edge. At a HIGH level, the non-inverting input is slightly lower than the voltage at the inverting input, such that the output of the comparator is LOW. The feedback provided via the resistor R9 allows the inverting input to be slightly higher than the non-inverting input when the input of the comparator 602 is HIGH.

When starting to rise, the inverting input rises quicker than the non-inverting input, such that the inverting input increases to be higher than the non-inverting input. The feedback loop 606 allows this to happen and the output of the comparator 602 transitions from HIGH to LOW. When coming down, an opposite response occurs, where the inverting input voltage decreases quickly and drops below the voltage of the non-inverting input and the output of the comparator 602 transitions from LOW to HIGH.

The coefficient of the filter formed by resistor R8 and capacitor C3 is set to allow the voltage of the inverting input to cross the voltage of the non-inverting input and fully transition to a next state. The coefficient may be set, for a current communication rate, to allow for the output of the comparator to transition between states at the appropriate speed. If the filter responds too quickly, then the non-inverting input will track the inverting input, instead of the voltage of the inverting input "crossing" the voltage of the non-inverting input. The term "crossing" referring to a voltage of an input increasing to and becoming higher than or decreasing to and becoming less than a voltage of another input. If the filter responds to slowly, then the non-inverting input may not have fully changed before a next transition is to be made, depending on speed of transitions (e.g., communication rate). For example, the non-inverting input may not have fully transitioned to a HIGH level, when it is already time to transition back to a LOW level.

Although the example of FIG. 6 is suitable for high-speed communication, the example of FIG. 6 may be stable in a "wrong" state, for example, when the optocoupler circuit 600 is first powered up and/or enabled. The optocoupler circuit 600 does however correct itself upon transitioning between HIGH and LOW states. As an example, when the optocoupler circuit 600 is initiated and the inverting input is LOW (e.g., 1.0V) and the non-inverting input is also LOW (e.g., 0.5V), then the output of the comparator is LOW e.g., 0V) when the output should be HIGH at the time due to the previous transition bringing the inverting input below the non-inverting input of the comparator 602. The output of the comparator 602 is correct as soon as the first transition happens (i.e. the inverting input goes HIGH). When the input transitions to a HIGH voltage state, then the output will in a LOW state because the input voltage is greater than the non-inverting input (or feedback reference) voltage. The correct output is an opposite state than the inverting input. If the optocoupler circuit 600 experiences noise that causes an incorrect state and/or is initiated in an incorrect state, the optocoupler circuit 600 corrects itself upon transitioning between states one or more times.

For the above-stated reasons, the optocoupler circuit 600 of FIG. 6 may be more suitable for higher-speed applications than the optocoupler circuit 500 of FIG. 5. The optocoupler circuit 600 may be used, for example, in applications where edge-precision matters. For cases where a wrong state could cause a problem, the optocoupler circuit 500 of FIG. 5 may be used, since the optocoupler circuit 500 is not able to be initiated in a wrong state.

Figure 7:
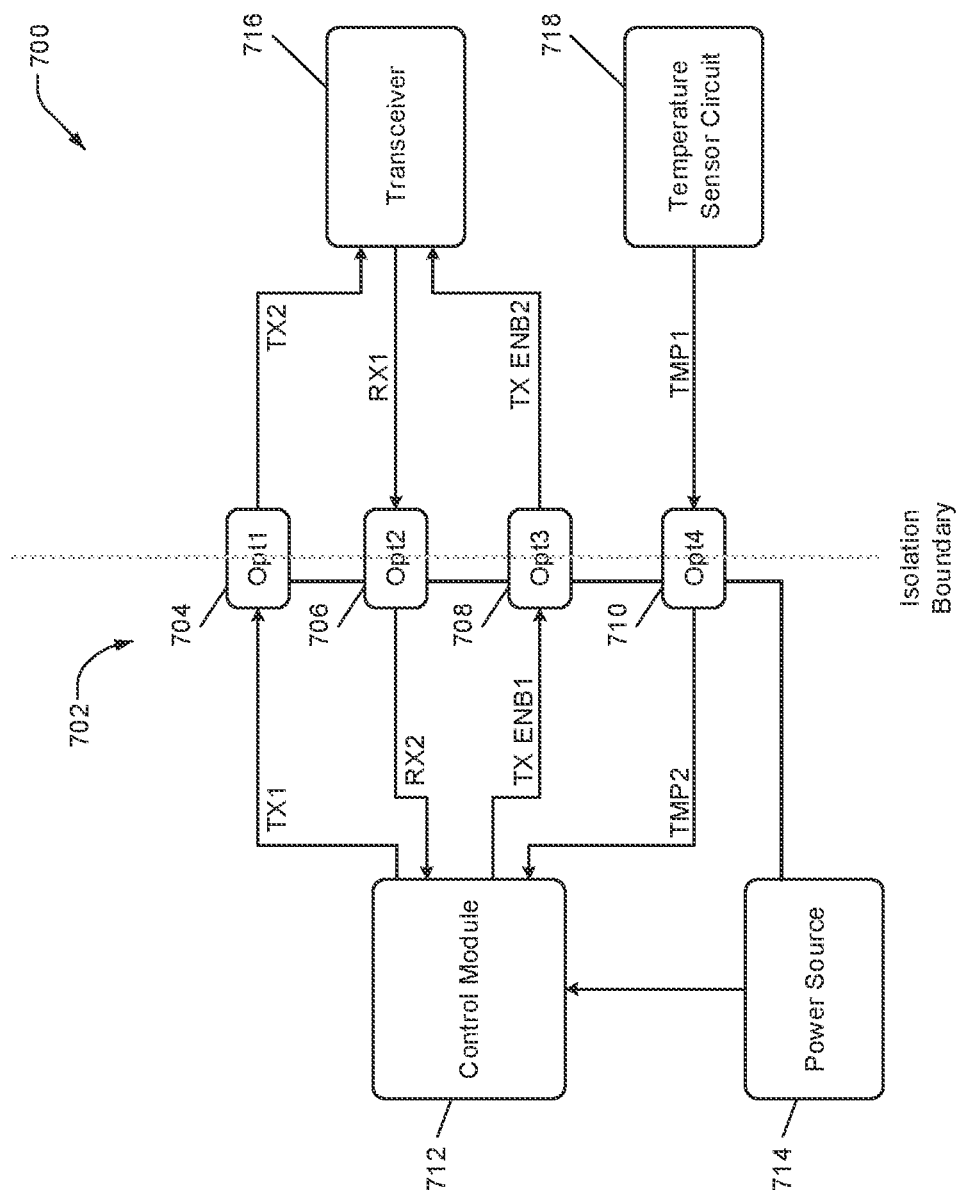
FIG. 7 is a communication system including an isolation boundary with optocoupler circuits in accordance with the present disclosure.

FIG. 7 shows a communication system 700 including an isolation boundary 702 with optocoupler circuits 704, 706, 708, 710. The communication system 700 includes a control module 712, a power source 714, a transceiver 716 and a temperature sensor circuit 718. The optocoupler circuits 704, 706, 708, 710 and the control module 712 may receive power from the power source 714. The voltages supplied to the optocoupler circuits 704, 706, 708, 710 and the control module 712 may be the same or different. In one embodiment, the optocoupler circuits 704, 706, 710 are implemented as the optocoupler circuit of FIG. 6 and the optocoupler circuit 708 is implemented as the optocoupler circuit of FIG. 5. The optocoupler circuits 704, 708 are configured, such that the inputs of the optocoupler circuits 704, 708 are connected to the control module 712. The optocoupler circuit 706 is configured, such that the input of the optocoupler circuit 706 is connected to the transceiver 716. The optocoupler circuit 710 is configured, such that the input of the optocoupler circuit 710 is connected to the temperature sensor circuit 718.

The transceiver 716 may communicate with, for example, the network device 269 of FIG. 2. As an example the temperature sensor circuit 718 may be used to detect temperature of the compressor 102, the condenser 104, the evaporator 108, ambient air, a motor, etc. The temperature sensor circuit 718 may convert an analog signal to a PWM signal having a corresponding duty cycle. The PWM signal may be provided as an input to the optocoupler circuit 708. The optocoupler circuit 708 has short response time to provide precise rising and falling edges that correspond to the rising and falling edges of the PWM signal.

The control module 712 generates a transmit signal TX1 and a transmit enable signal TX ENB1. The optocoupler circuits 704, 708 based on the signals TX1, TX ENB1, generate respectively signals TX2, TX ENB2, which are provided to the transceiver 716. The transceiver generates a receive signal RX1 when data is received from the network device 269. The optocoupler circuit 706 generates a second receive signal RX2 based on the receive signal RX1. The temperature sensor 718 generates a temperature signal TMP1. The optocoupler circuit 710 generates a second temperature signal TMP2 based on the temperature signal TMP1. The control module 712 may control operation of, for example, the refrigeration system 100, the compressor 102, the condenser 104, and/or the evaporator 108 based on the temperature signal TMP2. The control module 712 may generate the transmit signal TX1 based on the temperature signal TMP2. The transmit signal TX1 may include a temperature indicated in the temperature signal TMP2. The transmit signal TX ENB1 may be generated to enable transmission and to indicate to the transceiver not to receive data during transmission of the data in the transmit signal TX2. When the transmit enable signal TX ENB1 is LOW (or OFF), then the control module 712 and transceiver 716 are not transmitting and may be receiving.

Although the terms first, second, third, etc. may be used herein to describe and/or distinguish between various voltages, currents, resistances, capacitances, signals, elements, components, etc. these items should not be limited by these terms. These terms may be only used to distinguish one item from another item. Terms such as "first," "second," and other numerical terms when used herein do not imply a sequence or order unless clearly indicated by the context. Thus, a first item discussed herein may be termed a second item without departing from the teachings of the example implementations.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An optocoupler circuit comprising:
   a first resistor;
   a second resistor
   an optocoupler comprising a light source and a phototransistor, wherein the light source is connected to form a first voltage divider with the first resistor, wherein the phototransistor is connected to form a second voltage divider with the second resistor, wherein the optocoupler transitions an output of the second voltage divider between a first level and a second level, and wherein magnitudes of the first level and the second level are greater than zero;
   a reference circuit configured to output a reference voltage; and
   a comparator comprising a first input and a second input, wherein the first input receives an output of the second voltage divider, wherein the second input receives the reference voltage, and wherein an output of the comparator transitions between a third level and a fourth level based on a comparison between the output of the first voltage divider and the reference voltage.

2. The optocoupler circuit of claim 1, further comprising a Zener diode comprising a cathode, wherein the cathode is connected to the first input of the comparator.

3. The optocoupler circuit of claim 1, further comprising an input transistor connected in series with the light source.

4. The optocoupler circuit of claim 3, further comprising a third resistor connected in series with the light source and the input transistor.

5. The optocoupler circuit of claim 4, wherein the input transistor and the third resistor are collectively connected in parallel with the first resistor.

6. The optocoupler circuit of claim 1, further comprising a pull-up resistor connected to the output of the comparator.

7. The optocoupler circuit of claim 1, wherein at least one of:
   the first resistor and the second resistor are connected to different ground reference terminals; or
   the first voltage divider receives power from a first power source and the second voltage divider receives power from a second power source.

8. The optocoupler circuit of claim 1, wherein the reference circuit comprises:
   a third resistor connected to the second input of the comparator and receiving a supply voltage; and
   a fourth resistor connected to the second input and a ground reference terminal.

9. The optocoupler circuit of claim 8, wherein the reference circuit further comprises a capacitor connected in parallel with the fourth resistor.

10. A system comprising:
    the optocoupler circuit of claim 1, wherein the optocoupler circuit is configured to generate an output signal based on received transmit enable signal; and
    a control module configured to receive the output signal and perform an operation based on the output signal.

11. A system comprising:
a temperature sensor configured to generate a temperature signal;
the optocoupler circuit of claim 1, wherein the optocoupler circuit is configured to generate an output signal based on the temperature signal; and
a control module configured to receive the output signal and perform an operation based on the output signal.

12. An optocoupler circuit comprising:
a first resistor;
a second resistor
an optocoupler comprising a light source and a phototransistor, wherein the light source is connected to form a first voltage divider with the first resistor, wherein the phototransistor is connected to form a second voltage divider with the second resistor, wherein the optocoupler transitions an output of the second voltage divider between a first level and a second level, and wherein magnitudes of the first level and the second level are greater than zero;
a comparator comprising a first input and a second input, wherein the first input receives an output of the first voltage divider; and
a feedback loop comprising a filter, wherein the feedback loop is connected to the second input and the output of the comparator, wherein the filter receives the output of the second voltage divider and provides a reference voltage to the second input of the comparator, and
wherein the comparator is connected to the output of the second voltage divider, receives the reference voltage and detects a change in the output of the second voltage divider, and based on the change, transitions an output of the comparator between a third level and a fourth level.

13. The optocoupler circuit of claim 12, further comprising a Zener diode comprising a cathode, wherein the cathode is connected to the first input of the comparator.

14. The optocoupler circuit of claim 12, further comprising an input transistor connected in series with the light source.

15. The optocoupler circuit of claim 14, further comprising a third resistor connected in series with the light source and the input transistor.

16. The optocoupler circuit of claim 15, wherein the input transistor and the third resistor are collectively connected in parallel with the first resistor.

17. The optocoupler circuit of claim 12, further comprising a pull-up resistor connected to the output of the comparator.

18. The optocoupler circuit of claim 12, wherein at least one of:
the first resistor and the second resistor are connected to different ground reference terminals; or
the first voltage divider receives power from a first power source and the second voltage divider receives power from a second power source.

19. The optocoupler circuit of claim 12, wherein the filter comprises:
a third resistor connected to the second input of the comparator and receiving the output of the second voltage divider; and
a capacitor connected to the second input and a ground reference terminal.

20. The optocoupler circuit of claim 12, wherein:
the feedback loop comprises a third resistor and a fourth resistor connected in series;
the third resistor receives the output of the second voltage divider; and
the fourth resistor is connected to the output of the comparator.

21. The optocoupler circuit of claim 20, further comprising a capacitor connected to the third resistor and the fourth resistor and a ground reference terminal.

22. The optocoupler circuit of claim 20, wherein the fourth resistor feeds back at least a portion of the output of the comparator to the second input of the comparator.

23. A communication system comprising:
the optocoupler circuit of claim 12;
a transceiver connected to the optocoupler circuit and configured to communicate with a network device; and
a control module connected to the optocoupler circuit and configured to transmit a first signal to the transceiver or receive a second signal from the transceiver via the optocoupler circuit.

24. A system comprising:
a temperature sensor configured to generate a temperature signal;
the optocoupler circuit of claim 12, wherein the optocoupler circuit is configured to generate an output signal based on the temperature signal; and
a control module configured to receive the output signal and perform an operation based on the output signal.

* * * * *